United States Patent
Jarvis et al.

(10) Patent No.: US 6,294,397 B1
(45) Date of Patent: Sep. 25, 2001

(54) DROP-IN TEST STRUCTURE AND ABBREVIATED INTEGRATED CIRCUIT PROCESS FLOW FOR CHARACTERIZING PRODUCTION INTEGRATED CIRCUIT PROCESS FLOW, TOPOGRAPHY, AND EQUIPMENT

(75) Inventors: Richard W. Jarvis; Iraj Emami, both of Austin, TX (US); Charles E. May, Gresham, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/262,574

(22) Filed: Mar. 4, 1999

(51) Int. Cl.[7] ............................. H01L 21/66; G01R 31/26

(52) U.S. Cl. ............................................ 438/17; 438/11

(58) Field of Search ................................. 438/16, 17, 18, 438/928, 11

(56) References Cited

U.S. PATENT DOCUMENTS

| | | |
|---|---|---|
| 3,751,647 | 8/1973 | Maeder et al. . |
| 3,842,491 | 10/1974 | Depuy et al. . |
| 3,983,479 | 9/1976 | Lee et al. . |
| 4,855,253 | 8/1989 | Weber . |
| 5,159,752 | 11/1992 | Mahant-Shetti et al. . |
| 5,514,974 | 5/1996 | Bouldin . |
| 5,576,223 | * 11/1996 | Zeininger et al. ..................... 438/16 |
| 5,773,315 | 6/1998 | Jarvis . |
| 5,801,394 | * 9/1998 | Isobe ..................................... 257/48 |
| 5,959,459 | 9/1999 | Satya et al. . |

OTHER PUBLICATIONS

C. Hess, Defect Cluster Analysis to Detect Equipment Specific Yield Loss Based on Yield–to Area Oct. 1997.*

Hess et al., "Modeling of Real Defect Outlines for Defect Size Distribution and Yield Prediction," Proc. IEEE 1993 Int. Conference on Microelectronic Test Structures, vol. 6, Mar. 1993.

Hess et al., "Drop In Process Control Checkerboard Test Structure for Efficient Online Process Characterization and Defect Problem Debugging," Proc. Ieee 1994 Int. Conference on Microelectronic Test Structures, vol. 7, Mar. 1994.

(List continued on next page.)

Primary Examiner—Charles Bowers
Assistant Examiner—Erik Kielin
(74) Attorney, Agent, or Firm—Kevin L. Daffer; Conley, Rose & Tayon P.C.

(57) ABSTRACT

A drop-in test structure fabricated upon a virtual integrated circuit elevational profile and a method for using the drop-in test structure for characterizing an integrated circuit production methodology and integrated circuit fabrication equipment are described. According to an embodiment, the test structure may be fabricated upon an elevational profile corresponding elevationally to a complete or substantially complete production integrated circuit topography. According to an alternative embodiment, the test structure may be fabricated upon an elevational profile corresponding elevationally to a partially complete production topography. The test structure and method may be used to characterize the underlying elevational profile and to identify both systematic and random defects either as part of routine monitoring or in response to the observance of defective chips using other monitoring. The test structure and method may also be used to characterize the effects of intentional modifications to existing processing parameters and equipment and to characterize the performance of new processes and equipment.

19 Claims, 7 Drawing Sheets

OTHER PUBLICATIONS

Hess et al., "Modeling of Test Structures for Efficient Online Defect Monitoring Using a Digital Tester," Proc. IEEE 1994 Int. Conference on Microelectronic Test Structures, vol. 7, Mar. 1994.

Hess, "Strategy to Optimize the Development, Use, and Dimension of Test Structures to Control Defect Appearance in Backend Process Steps," Proc. IEEE/SEMI 1994 Advanced Semiconductor Manufacturing Conference, vol. 5, Nov. 1994.

Hess et al., "Defect Parameter Extraction in Backend Process Steps Using a Multilayer Checkerboard Test Structure," Proc. IEEE 1995 Int. Conference on Microelectronic Test Structures, vol. 8, Mar. 1995.

Hess et al., "Influence of Short Circuits on Data of Contact & Via Open Circuits Determined by a Novel Weave Test Structure," Proc. IEEE 1995 Int. Conference on Microelectronic Test Structures, vol. 8, Mar. 1995.

Hess et al., "Resistance Modeling of Test Structures for Accurate Fault Detection in Backend Process Steps Using a Digital Tester," Proc. IEEE 1995 Int. Conference on Microelectronic Test Structures, vol. 8, Mar. 1995.

Hess et al., "A Digital Tester Based Measurement Methodology for Process Control in Multilevel Metallization Systems," Proc. SPIE's 1995 Microelectronic Manufacturing Conference, vol. 2637, Oct. 1995.

Hess et al., "Control of Application Specific Interconnection on Gate Arrays Using an Active Checkerboard Test Structure," Proc. IEEE 1996 Int. Conference on Microelectronic Test Structures, vol. 9, Mar. 1996.

Hess et al., "Correlation Between Particle Defects and Electrical Faults Determined with Laser Scattering Systems and Digital Measurements on Checkerboard Test Structures," Proc. SPIE's 1996 Microelectronic Manufacturing Conference, vol. 2874, Oct. 1996.

Hess et al., "Issues on the Size and Outline of Killer Defects and their Influence on Yield Modeling," Proc. IEEE/SEMI 1996 Advanced Semiconductor Manufacturing Conference, vol. 7, Nov. 1996.

Hess et al., "Determination of Defect Size Distributions Based on Electrical Measurements at a Novel Harp Test Structure," Proc. IEEE 1997 Int. Conference on Microelectronic Test Structures, vol. 10, Mar. 1997.

Hess et al., "Issues on Short Circuits in Large On–Chip Power MOS–Transistors Using a Modified Checkerboard Test Structure," Proc. IEEE 1997 Int. Conference on Microelectronic Test Structures, vol. Mar. 10, 1997.

Hess et al., "Customized Checkerboard Test Structures to Localize Interconnection Point Defects," Proc. 1997 VLSI Multilevel Interconnection Conference, vol. 14, Jun. 1997.

Hess et al., "Comparison of Defect Size Distributions Based on Electrical and Optical Measurement Procedures," Proc. IEEE/SEMI 1997 Advanced Semiconductor Manufacturing Conference, vol. 8, Sep. 1997.

Hess et al., "Defect Cluster Analysis to Detect Equipment Specific Yield Loss Based on Yield–to–Area Calculations," Proc. SPIE's 1997 Microelectronic Manufacturing Conference, vol. 3216, Oct. 1997.

Hess et al., "Strategy to Disentangle Multiple Faults to Identify Random Defects within Test Structures," Proc. IEEE 1998 Int. Conference on Microelectronic Test Structures, vol. 11, Mar. 1998.

Hess et al., "Wafer Level Defect Density Distribution Using Checkerboard Test Structures," Proc. IEEE 1998 Int. Conference on Microelectronic Test Structures, vol. 11, Mar. 1998.

Hess et al., "Novel Methodology to Include all Measured Extension Values per Defect to Improve Defect Size Distributions," Proc. IEEE/SEMI 1998 Advanced Semiconductor Manufacturing Conference, vol. 9, Sep. 1998.

* cited by examiner

DROP-IN TEST STRUCTURE AND ABBREVIATED INTEGRATED CIRCUIT PROCESS FLOW FOR CHARACTERIZING PRODUCTION INTEGRATED CIRCUIT PROCESS FLOW, TOPOGRAPHY, AND EQUIPMENT

BACKGROUND OF THE INVENTION

1. Field of the Invention

This invention relates to integrated circuit fabrication and, more particularly, to a drop-in test structure fabricated upon an integrated circuit topography for characterizing an integrated circuit production methodology, an integrated circuit topography, and equipment used in forming the integrated circuit.

2. Description of the Related Art

Fabrication of integrated circuits requires that precisely controlled quantities of impurities be introduced into small regions of a semiconductive substrate and that these regions be interconnected to create microelectronic components and integrated circuits. The patterns used to define such regions and interconnections are created using lithographic processes. To form the patterns, layers of photoresist material are applied as thin films to the upper surfaces of the substrate or to elevational profiles successively built upon the substrate. The photoresist is selectively exposed to a form of radiation such as specific optical wavelengths, ultraviolet light ("UV light"), X rays, or electrons. An exposure tool and mask are used to effect the exposure to UV light or X rays, while a data tape is used in electron beam lithography.

The exposure mask includes clear and opaque regions that define the features to be patterned in the photoresist. Areas of the photoresist exposed to radiation may be rendered preferentially soluble or insoluble, relative to unexposed photoresist, in a developing solvent. The change in solubility depends upon the type of photoresist used. Following development of the photoresist, the patterned photoresist is used as a mask during removal of exposed portions of the underlying substrate or conductive materials such as polycrystalline silicon or metal. As such, the pattern is transferred from the exposure mask to the integrated circuit topography.

Projection printing is the predominant method used for optically transferring a pattern from an exposure mask to a photoresist-coated wafer. In projection printing, wafers are separated from the masks by large distances. Lens elements or mirrors are used to focus the mask image onto the photoresist. Current projection printing systems use refractive optics to project the mask image onto the photoresist. Because it is impractical to build a refractive lens capable of projecting an image across an entire wafer, refractive systems project the image across a portion of the wafer. The projection field is then moved across the wafer using a "step-and-repeat" procedure. Masks used with step-and-repeat aligners are commonly referred to as "reticles" to distinguish them from masks that project images across an entire wafer.

The manufacture of semiconductor integrated circuits involves a loss of chip yield due to the presence of various defects. The two basic types of defects that may occur when conductive layers are formed on an integrated circuit are extra material defects ("EMD") and missing material defects ("MMD"). EMD may occur when the conductive structures include material extending beyond predefined boundaries. Such material may extend to another conductive structure, causing a "short" to be formed between the two conductive structures. MMD may occur when a gap is formed in a conductive structure. Such a defect may cause the formation of an "open" conductive structure in which the continuity of the conductive structure is broken.

Defects that occur in a regular or repeating pattern typically result from shortcomings in the processing methodology, such as misalignment of a reticle or tilt of the wafer. These defects are known as systematic defects. In contrast, random defects occur without a pattern. Both EMD and MMD may be either systematic or random defects. For example, systematic problems in step coverage across areas of large elevational disparity may lead to the formation of open circuits due to missing material at the step. As another example, short circuits may be formed due to random distribution of particulate matter upon the die (which may result in connections between adjacent conductive lines) or upon the reticle used to pattern the die (which may result in conductive material between adjacent lines being retained rather than removed due to undesired masking by the particulate matter).

In order to detect defects that arise during fabrication of integrated circuits, test structures may be formed upon designated sites on a semiconductor wafer. Formation of the test structures may include multiple processing steps different from processes used to form production integrated circuits. For example, different reticles may be used to pattern successive layers of the test structures than are used to pattern the production die. As such, the elevational profile of a test structure that includes multiple layers of patterned conductive material may differ from the elevational profile of neighboring integrated circuits. Consequently, such test structures may not give an accurate indication of systematic problems that may occur due to elevational disparity in the production integrated circuit or random problems that occur in a production setting.

Alternatively, a small area within a production die may be reserved for a test device or devices. Test devices so formed may avoid the problems associated with using non-production reticles for successive layers of the test elevational profile. Forming test structures as part of a production die, however, significantly reduces the area available for the test structures. As such, random defects occurring with low frequency might not be detected.

SUMMARY OF THE INVENTION

The problems outlined above may be solved by the technique hereof for forming and using a test structure with a virtual integrated circuit methodology ("virtual methodology") and a virtual integrated circuit elevational profile ("virtual elevational profile" or "virtual profile") formed using the virtual methodology. The virtual methodology and topography may be used for characterizing a production integrated circuit methodology ("production methodology") and a production integrated circuit topography ("production topography") formed using the production methodology. The virtual methodology and topography may also be used to evaluate equipment for forming the production topography. As used in this application, "production integrated circuit topography" describes a topography that is contained within a packaged integrated circuit intended for use by a consumer of a product including the integrated circuit as an integral component. That is, a production topography is descriptive of an integrated circuit die that has been scribed, separated from a wafer, tested, packaged, and shipped. "Production integrated circuit fabrication methodology" describes a process for fabricating a production integrated circuit topography.

"Virtual integrated circuit elevational profile" as used in this application refers to a set of sequentially formed elevational features encompassing a subset of a production topography. That is, a virtual profile is formed according to a subset of the sequence of steps constituting the production methodology, whereas a production topography is formed according to a complete production methodology sequence. A virtual elevational profile is elevationally similar to a production topography, i.e., a virtual topography possesses a subset of the elevational features of a production topography such as transistor gate structures and interconnects. A virtual topography may lack, however, features such as source and drain dopants that do not influence the elevational profile of the topography. "Virtual integrated circuit methodology" describes a process for fabricating a virtual integrated circuit topography. A virtual methodology omits from a corresponding production methodology steps that do not affect elevational characteristics of the resulting topography and/or do not negatively impact the electrical or mechanical characteristics of the resulting topography. As such, a virtual topography emulates a production topography elevationally without requiring all of the processing steps necessary for fabricating the production topography.

For example, various implant steps (e.g., well implants, channel stop implants, gate doping, source and drain implants) and cleaning steps (e.g., removal of native oxide from the semiconductor substrate) may be eliminated from the process flow when forming a virtual elevational profile. Upon formation, the virtual elevational profile resembles elevationally at least a portion of the production topography. Correspondingly, many of the defects introduced during the production methodology will also be introduced during the virtual methodology. As such, the virtual methodology and virtual elevational profile may be used to characterize the production methodology and production topography.

A production topography is considered to be elevationally complete prior to scribing and separation of the die from the wafer. As such, a virtual profile may represent either a substantially elevationally complete production topography or a partially complete production topography. That is, according to an embodiment, a virtual elevational profile may be formed by a majority of steps used to produce the elevational features of an integrated circuit (that is, the virtual elevational profile may be formed according to a "full" virtual flow). According to an alternative embodiment, a virtual elevational profile may be formed by a minority of steps used to produce elevational features of the integrated circuit (that is, the virtual elevational profile may be formed according to a "short" virtual flow). The virtual profile includes features that determine elevational disparity of the production topography (such as conductive lines) while preferably omitting features that do not impact upon elevational disparity (such as source and drain impurity distributions).

The production methodology to be characterized may include using a step-and-repeat process of patterning successively deposited conductive layers. As such, the virtual methodology will include using the step-and-repeat process. A test reticle having a test pattern thereon may be substituted for a production reticle and used to pattern the test structure upon select die of the wafer. Preferably, the test structure occupies substantially an entire chip or die when patterned, so that the test structure may be used to detect random defects occurring with low frequency. According to an embodiment, the test structure may be patterned upon a substantially complete virtual elevational profile (i.e., an elevational profile fabricated according to the full virtual methodology). According to an alternate embodiment, the test structure may be patterned upon an upper surface of a partially completed virtual elevational profile. That is, the test structure may be patterned upon an elevational profile that is produced by a short virtual methodology rather than the full virtual methodology.

The virtual process flow described herein has several potential advantages. Implementing new technologies or new tools may be expedited by using the abbreviated flow procedure. For example, if the use of a new metal etch tool were contemplated, knowledge about the resulting topography would be desirable. Wafers could go through the existing process flow through the deposition and patterning of polysilicon to form gate conductors. Subsequent ion implants used to form lightly doped drain areas and source/drain areas could be bypassed. Instead, the wafer could be transferred directly to the dielectric and then metallization, followed by patterning and etching using the new equipment.

The virtual methodology may also allow expedited testing of new technology or materials using existing equipment. For example, a novel interlevel dielectric material may be evaluated for the degree of planarity that may be achieved. By skipping non-topographical steps such as ion implants, information on the effects of new equipment, processes, and/or materials on the integrated circuit topography may be obtained in days rather than weeks. The abbreviated flow methodology may be performed using the same programs used by the computer system controlling the full flow by simply bypassing undesired steps. By avoiding unnecessary steps that do not affect the elevational profile, the abbreviated process flow used to form the virtual topography advantageously saves both time and material resources.

Further, the virtual methodology may be used to test the response of the production methodology or equipment to changes made as a result of defects identified during integrated circuit production. For example, electrical testing of product wafers may reveal the presence of defects. Modifications may then be required in processing parameters (such as temperature and pressure) or in the equipment (e.g., replacement of defective components). Before full-scale integrated circuit production is resumed, testing of the system may be desirable to ensure that the problems have been corrected. If the defects are found to arise from elevational causes such as poor step coverage or random particulate contamination, it may be unnecessary to fabricate test integrated circuits that include non-elevational features such as implant areas. In order to conserve time and material resources, the virtual methodology may be used for fabricating test structures.

According to an embodiment, a test reticle may be used to pattern only select chip sites upon a wafer in order to characterize the underlying elevational profiles. According to an alternative embodiment, test structures may be formed across an entire wafer to enable identification of intra-wafer variations in processing. For example, formation of test structures across an entire wafer may reveal a regular pattern of defects across the wafer attributable to systematic errors in processing. Forming test structures across an entire wafer may also reveal that processing conditions vary between the center of the wafer and the edges such that functioning integrated circuits are produced only in certain regions of the wafer rather than across the entire wafer. According to this embodiment, the test structures may be formed either on substantially complete or on partially complete elevational profiles.

In an embodiment, the test structure includes at least two conductive lines. The lines are formed on the upper surface of a virtual elevational profile. The first conductive line is preferably formed in a comb-like structure. The first conductive line preferably includes a main body portion with projections extending from the main body portion. The second conductive line is preferably routed in a serpentine fashion around the projections of the first conductive line. The second conductive line may be positioned such that a distance between the first and second conductive lines is constant.

The test structure may also include additional conductive lines. A third conductive line and a fourth conductive line may also be incorporated into the test structure. When four conductive lines are incorporated into the test structure, two of the lines, preferably the first and the fourth conductive lines, are comb-like lines. Both the first and fourth lines include projections extending out from a main portion of the conductive lines. The projections extend toward and away from the opposing conductive line. Sandwiched between the comb-like first and fourth lines, the second and third conductive lines are routed in serpentine fashion between the projections of the first and fourth lines. Preferably the spacing between all of the lines is substantially constant such that at any given point the distance between neighboring lines is substantially the same. The use of comb-like and serpentine lines allows a greater surface area of the elevational profile to be covered while maintaining a minimal number of conductive lines. The use of comb-like and serpentine lines also improves discriminating between open and shorting defect mechanisms.

The width of the individual conductive lines may be varied to allow testing of the production of wide conductive lines coupled to narrow conductive lines on the integrated circuit elevational profile. Alternatively, the conductive lines may be formed such that all of the conductive lines have substantially the same width and a constant spacing between the conductive lines. By forming conductive lines having the same width and spacing, the test structure may be used for particle size testing, as well as defect detection. Examples of conductive materials include, but are not limited to, conductive metals (such as aluminum, titanium, and cobalt) and silicided polysilicon.

Stimuli may be applied to the test structure in order to detect the presence of defects in the test structures. The stimuli applied to the test structure may be electrons from an electrical tester. Testing pads may be incorporated into the test structure. The test pads are attached to each of the conductive lines to allow electrical testing of the conductive lines. By incorporating test pads into the structure, the presence of extra material defects and missing material defects may be detected electrically. The test pads are preferably connected to the conductive lines to allow testing of shorts between the lines and to find opens in the conductive lines. The pads are preferably placed at opposed ends of a conductive line to allow testing of the continuity of the entire conductive line. Extra material defects may be detected by electrically testing for connectivity between the conductive lines of the test structure (comb-to-serpentine, comb-to-comb, or serpentine-to serpentine). Missing material defects may be detected by testing for continuity of a conductive line (e.g., by probing a serpentine line for conductivity).

Alternatively, the stimuli may be visible radiation from a light microscope. Illumination of the test structure generates an image that may be analyzed for the presence of defects by contrasting the observed test pattern with a pattern that would be expected in the absence of defects. For example, test structure areas void of conductive material should have a different intensity under visible radiation than areas in which conductive material is present. A deviation from the expected optical intensity would then indicate a potential defect.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
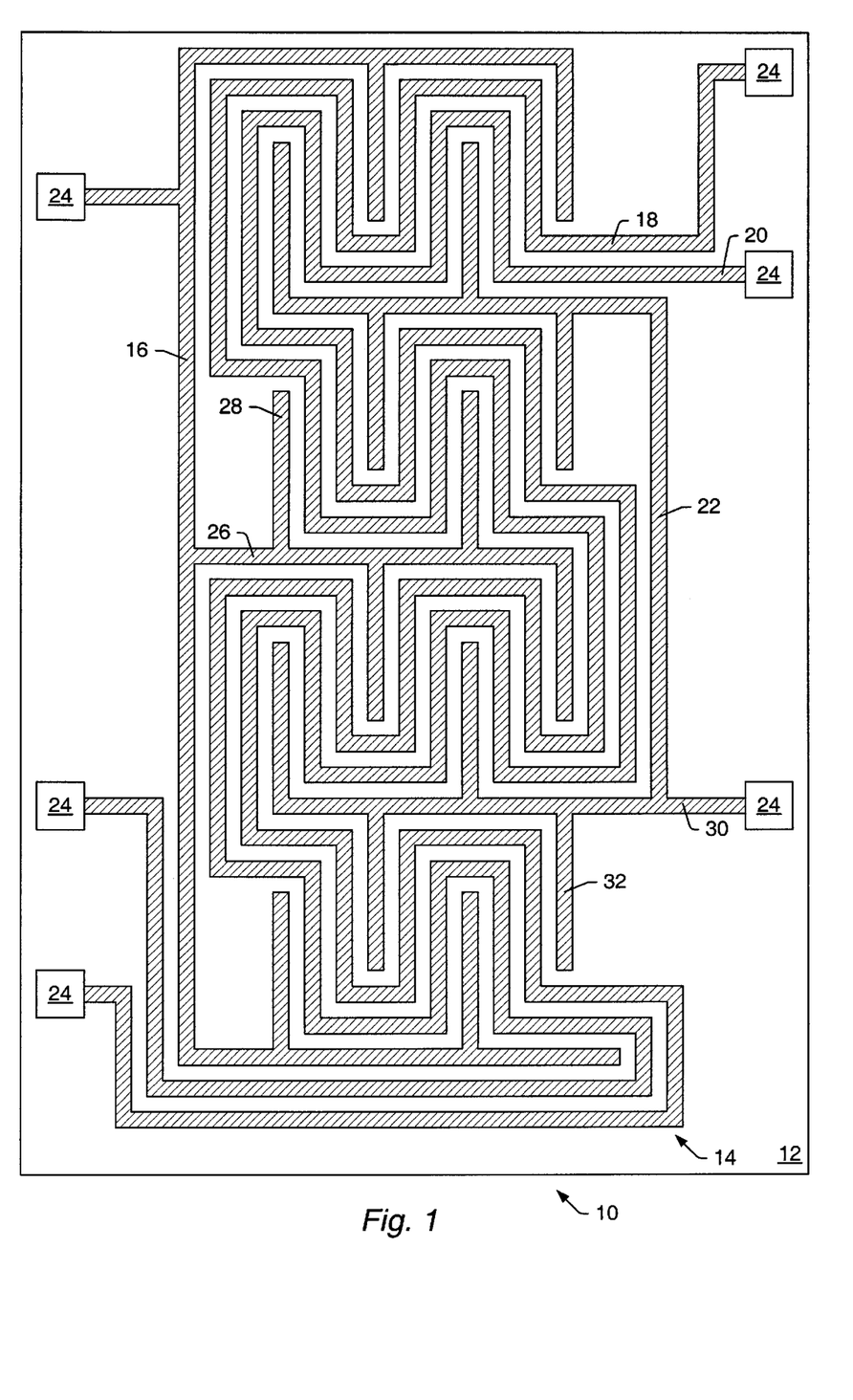
FIG. 1 depicts a top view of a test reticle that may be used to pattern a test structure upon an integrated circuit elevational profile.

Turning now to the drawings, FIG. 1 depicts a top view of an embodiment of a test reticle that may be used to pattern a test structure upon an integrated circuit elevational profile. Test reticle 10 preferably includes a plate 12 upon which a test pattern is formed. A test pattern 14 is depicted in FIG. 1. Test pattern 14 includes combs 16 and 22, which include projections 28 and 32, respectively, extending from main portions 26 and 30. Serpentine structures 18 and 20 are routed around combs 16 and 22. Test pattern 14 preferably further includes probe pads 24 at the ends of each of the combs and serpentines. The widths of the combs and serpentines, as well as the spacing between them, are preferably selected to correspond to the linewidths and separation between conductive interconnect lines that may be formed as part of a production integrated circuit.

As depicted in FIG. 1, the widths of the pattern lines are substantially similar to one another. Similarly, the spacings between lines are substantially similar. The linewidths and spacings, however, may differ among the various lines. Additionally, although the lines and the spacings between them are depicted as substantially constant, a portion of at least one of the lines may be wider than the remainder of the line in order to test the patterning of coupling between wider lines and narrower lines. Similarly, a portion of at least one of the spacings between lines may be wider than the remainder of the spacing in order to test the patterning of spacing between lines.

Preferably, test pattern 14 is designed such that a test structure formed using the test reticle covers substantially the entire area of a chip or die on a semiconductor wafer that is covered by a production integrated circuit topography. Alternatively, the test pattern may be used to form a test structure covering less than the area of a chip or die. It should be noted that the test pattern depicted in FIG. 1 is greatly simplified for purposes of illustration. It should also be noted that although test pattern 14 is depicted as including four conductive lines, test reticles may include test patterns having a different number of conductive lines (e.g., a single comb and a single serpentine).

Figure 2:
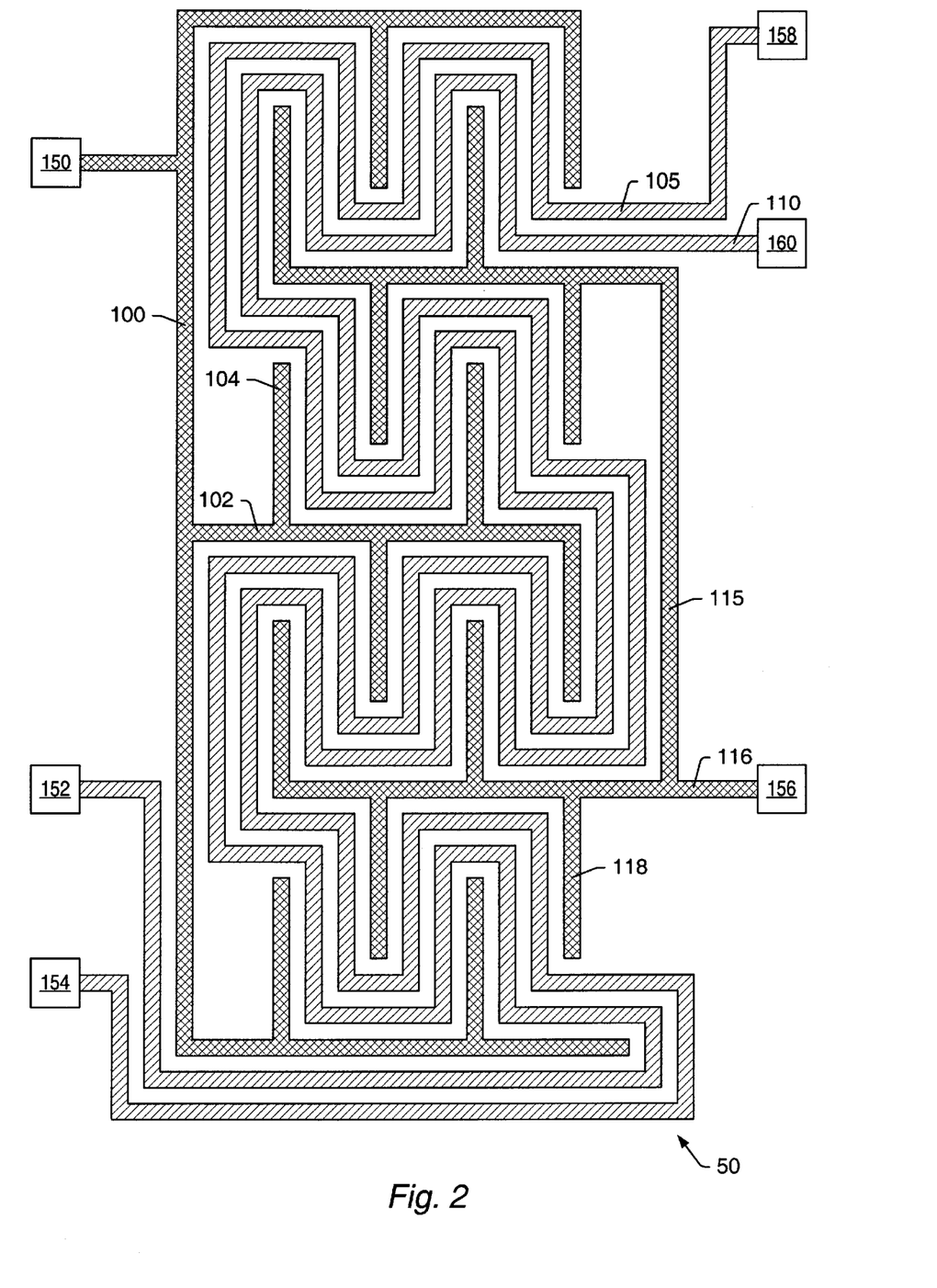
FIG. 2 depicts a top view of a test structure that has been patterned upon an integrated circuit elevational profile.

FIG. 2 illustrates a top view of a test structure formed upon an integrated circuit elevational profile using a reticle similar to test reticle 10 depicted in FIG. 1. It is to be noted that test structure 50, like test pattern 14 depicted in FIG. 1, is greatly simplified for illustrative purposes. The actual reticle test patterns and test structures may cover a substantially larger area with correspondingly greater complexity.

As depicted in FIG. 2, the widths of the conductive lines are substantially similar to one another. Similarly, the spacings between lines are substantially similar. The linewidths and spacings, however, may differ among the various lines. Additionally, although the conductive lines and the spacings between them are depicted as substantially constant, a portion of at least one of the conductive lines may be wider than the remainder of the line in order to test the coupling of wider lines to narrower lines. Similarly, a portion of at least one of the spacings between lines may be wider than the remainder of the spacing in order to test the patterning of spacing between conductive lines.

Preferably, test structure 50 covers substantially the entire area of a chip or die on a semiconductor wafer that is covered by a production integrated circuit topography. Alternatively, the test structure may cover less than the area of a chip or die. It should be noted that although test structure 50 is depicted as including four conductive lines, test structures having a different number of conductive lines (e.g., a single comb and a single serpentine) may be formed.

As shown in FIG. 2, first conductive line 100 and fourth conductive line 115 are comb-like lines. First conductive line 100 preferably includes a main portion 102 with projections 104 extending from the main portion. First conductive line 100 is coupled to pad 150, which is configured to receive an electrical probe. Fourth conductive line 115 preferably includes a main portion 116 with projections 118 extending from the main portion. Fourth conductive line 115 is coupled to pad 156, which is configured to receive an electrical probe. Pads 150 and 156 may be used for electrical testing of the test structure.

Second and third conductive lines 105 and 110 are preferably formed to meander through the comb-like projections of the first conductive line 100 and fourth conductive line 115. Second conductive line 105 and third conductive line 110 may also be coupled to test pads 152 and 158 (line 105) and test pads 154 and 160 (line 110) to allow electrical testing of the conductive lines.

The above-described test structure may be tested for missing material defects by electrically probing both probe pads on either line 105 or line 110. Under normal circumstances, probing the lines causes a current to flow between the pads. If an MMD is present in a line, however, no current will flow between the probe pads when the line is electrically probed. The test structure may be tested for extra material defects by electrically probing pads on adjacent lines. Under normal circumstances, no current will flow, because the lines are electrically isolated. If an EMD is present, however, current will flow between the adjacent lines through the extra material when the lines are electrically probed. By comparing the observed current conducted by the probed lines with the expected current, the presence of defects in the lines may be detected.

Figure 3:
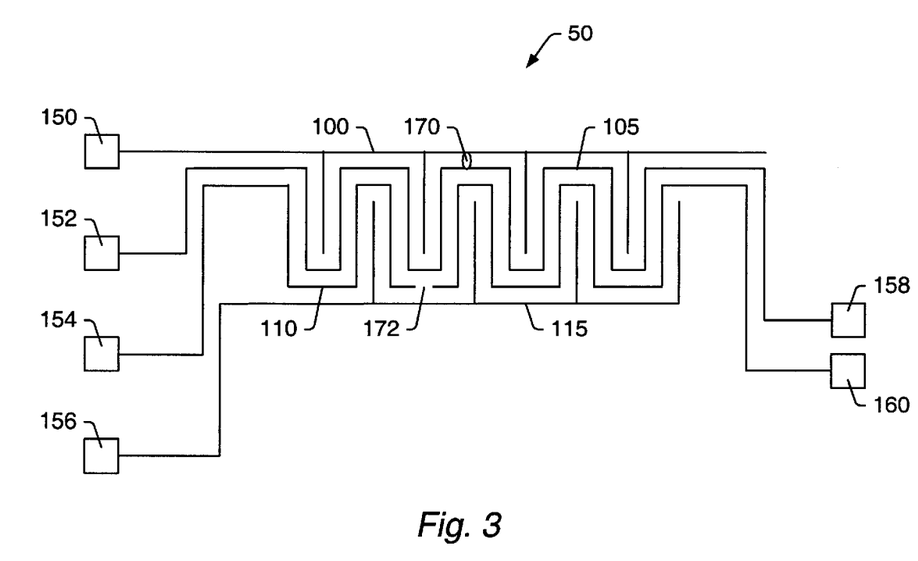
FIG. 3 depicts a schematic view of a test structure in which an extra material defect causes a short between two conductive lines and in which a missing material defect causes an open in another of the conductive lines.

FIG. 3 depicts a schematic view of test structure 50. As shown in FIG. 3, defect 170 connects first conductive line 100 and second conductive line 105. If an electrical probe is connected to pad 150 of line 100 and either pad 152 or pad 158 of line 105, a current will flow between the pads, indicating the presence of the extra material defect. FIG. 3 also depicts a missing material defect 172 in line 110. If pads 154 and 160 are electrically probed, no current will flow through line 110, indicating the presence of the missing material defect. Optical testing methods, in which the test structure is scanned by an operator or a computerized detector, may be used instead of electrical testing methods to detect extra material defects or missing material defects in the lines. Optical testing methods must be used to detect MMD in lines 100 and 115.

Figure 4:
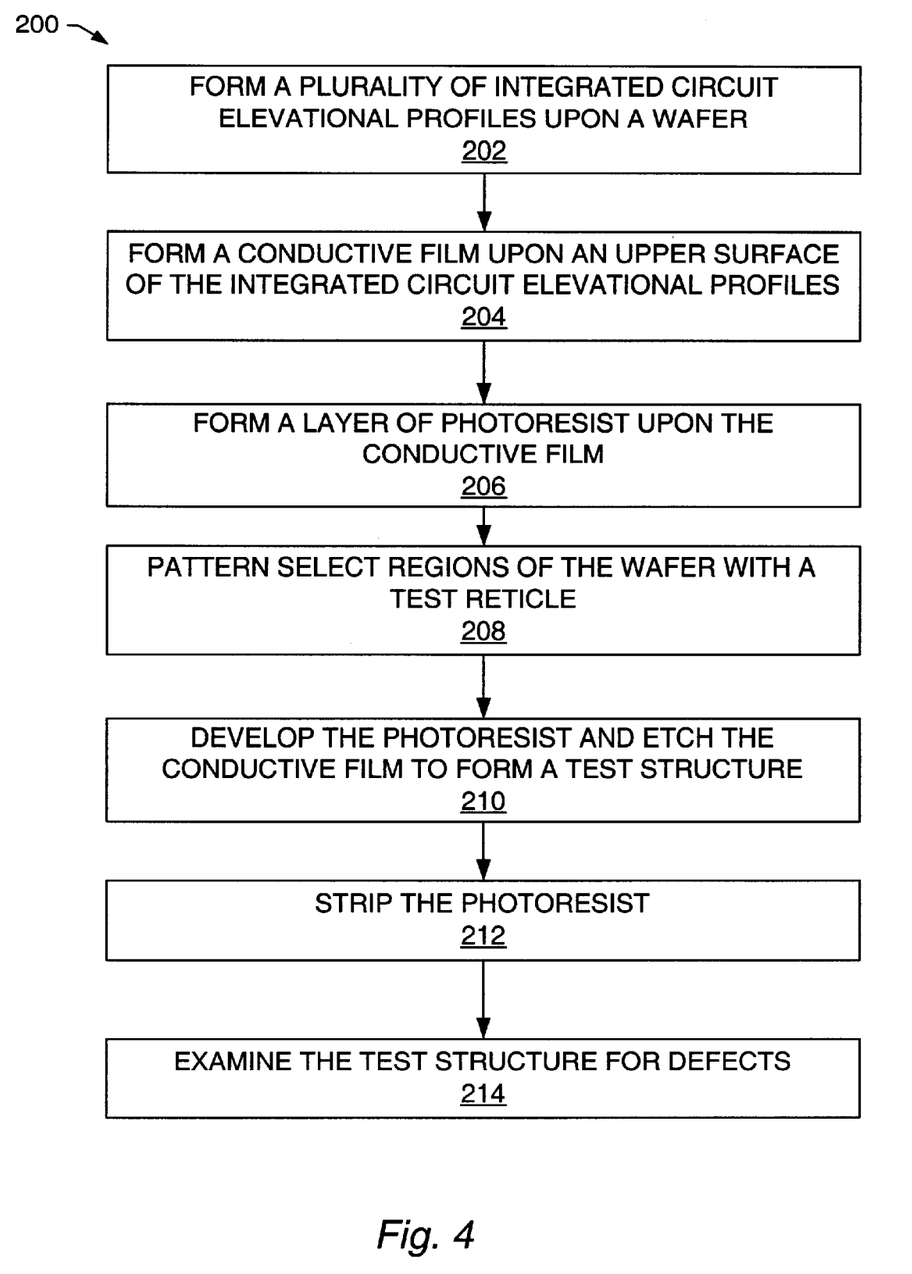
FIG. 4 depicts a flow diagram of a method for forming and testing a test structure upon an integrated circuit elevational profile.

FIG. 4 depicts a flow diagram of a method 200 for forming a test structure to characterize a process for fabricating an integrated circuit. Block 202 describes fabricating a plurality of integrated circuit elevational profiles upon a semiconductor wafer. Preferably, the elevational profiles are configured such that each elevational profile occupies an area of the wafer occupied by an integrated circuit chip or die. In an embodiment identified herein as "full flow," the elevational profiles may be fabricated according to a virtual methodology designed to produce elevational profiles elevationally similar to complete or substantially complete production topographies. That is, the full-flow elevational profiles include profiles corresponding elevationally to complete or substantially complete integrated circuits except for, e.g., a final metallized layer to be formed upon an upper surface of the topographies. The exact form of the elevational profiles will depend upon the integrated circuits being fabricated.

In an alternative embodiment identified herein as "short flow," the elevational profiles may be fabricated according to a portion of the full flow methodology. Fabrication of the elevational profiles according to the short flow includes suspending processing at an intermediate point prior to completion of the full flow. According to the short flow embodiment, the elevational profiles so formed correspond elevationally to elevational profiles designed so that they may be used to form functional integrated circuits if the process flow is continued. The short flow elevational profiles may include a minority of the features found in a production topography or a full flow production elevational profile. Alternatively, the short flow elevational profiles may include a majority, but less than substantially all, of the features found in a production topography or a full flow production elevational profile.

Following fabrication of the short-flow or full-flow integrated circuit elevational profiles, a conductive film may be formed upon the elevational profiles, as shown in block 204.

Formation of the conductive film may be accomplished using techniques well known in the art, such as chemical vapor deposition or sputtering. In an embodiment, the conductive film may be a metal, such as aluminum. Alternatively, the conductive film may be silicided polycrystalline silicon or any other conductive material. A layer of photoresist may then be deposited upon the conductive film, as shown by block 206.

The photoresist may be patterned by exposing select portions of the photoresist to radiation, as shown in block 208 of FIG. 4. Development of the patterned photoresist and removal of select portions of the patterned photoresist may be followed by etching of exposed portions of the underlying conductive layer, as shown in block 210, to form a test structure. The remaining photoresist may then be stripped from upon the test structure, as shown in block 212.

Figure 5:
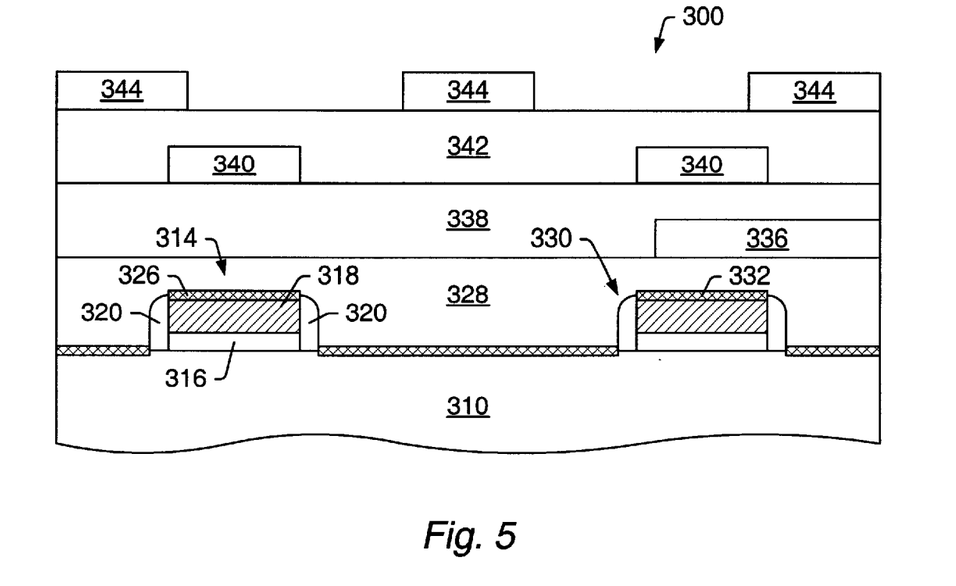
FIG. 5 depicts a cross-sectional view of a substantially completed integrated circuit elevational profile on which a test structure has been formed.

Turning now to FIG. 5, a cross-sectional view of an integrated circuit elevational profile fabricated according to an embodiment of the current methodology is depicted. FIG. 5 shows an elevational profile fabricated according to the full flow methodology. In the full flow methodology, substantially all elevational features of a production integrated circuit topography are present in the virtual integrated circuit elevational profile. Elevational profile 300 preferably includes a semiconductor substrate 310 upon which a plurality of dummy transistors has been formed. "Dummy transistor" as used in this application refers to a structure that has elevational features of a transistor but that is incapable of functioning as a transistor. For example, the dummy transistors may lack non-elevational features such as source and drain impurity areas. FIG. 5 illustrates exemplary dummy transistors 314 and 330. As shown in FIG. 5, dummy transistor 314 may include gate conductor 318 formed upon gate dielectric 316. Dummy transistor 314 may further include spacers 320 adjacent sidewall surfaces of the gate conductor. Silicides 326 may be formed upon upper surfaces of gate conductor 318 and semiconductor substrate 310. It should be noted that not all features depicted need be present in every dummy transistor formed upon the semiconductor substrate and that additional features not depicted may also be present.

First interlevel dielectric 328 is preferably formed across dummy transistors 314 and 330 to isolate them from subsequently formed conductive interconnect lines. The conductive interconnect lines may be designed to connect select transistors to form a production integrated circuit. As depicted in FIG. 5, a first interconnect 336 is formed upon an upper surface of first interlevel dielectric 328. Second interlevel dielectric 338 is shown formed across first interconnect 336 and the upper surface of first interlevel dielectric 328 to electrically isolate first-level interconnects such as interconnect 336 from subsequently formed higher-level interconnects, such as second interconnects 340. The actual number of interconnect and interlevel dielectric levels may vary depending upon design considerations for the integrated circuit. According to a production methodology, a final level of metallization may be formed upon an upper surface of interlevel dielectric 342 in order to substantially complete fabrication of an integrated circuit. According to the present process, a test reticle may be used to pattern a conductive layer deposited upon the interlevel dielectric to form test structure 344 at select die areas upon the wafer. In one embodiment, test structures may be patterned only upon a portion of the die sites. In an alternative embodiment, the test structures may be patterned upon substantially all die sites on the wafer to test for spatial variation in processing.

Figure 6:
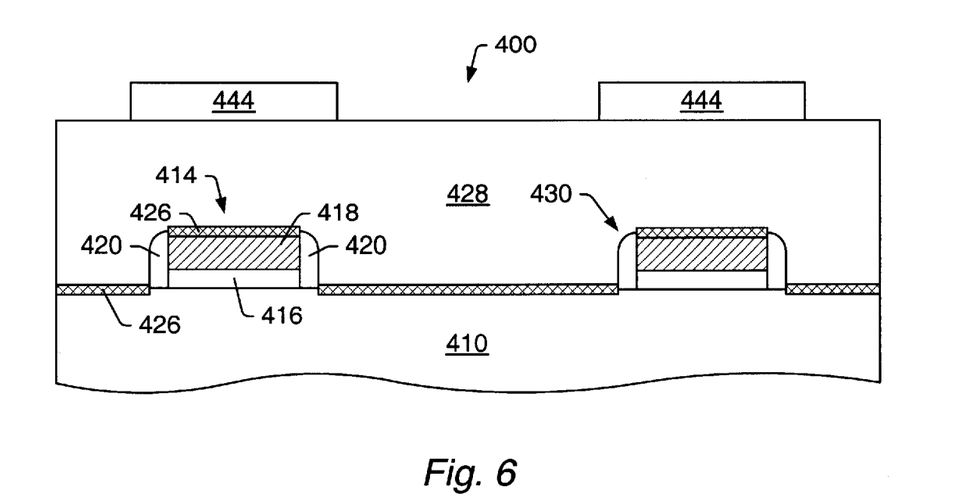
FIG. 6 depicts a cross-sectional view of a partially completed integrated circuit elevational profile on which a test structure has been formed.

FIG. 6 depicts a cross-sectional view of an integrated circuit elevational profile fabricated according to an alternative embodiment of the current methodology. FIG. 6 shows an elevational profile fabricated according to the short flow methodology. In the short flow methodology, only a portion of the elevational features of a production topography are present in the virtual integrated circuit elevational profile. Elevational profile 400 preferably includes a semiconductor substrate 410 upon which a plurality of dummy transistors has been formed. FIG. 6 illustrates exemplary dummy transistors 414 and 430. As shown in FIG. 6, dummy transistor 414 may include gate conductor 418 formed upon gate dielectric 416. Dummy transistor 414 may further include spacers 420 adjacent sidewall surfaces of the gate conductor. Silicides 426 may be formed upon upper surfaces of gate conductor 418 and semiconductor substrate 410. It should be noted that not all features depicted need be present in every dummy transistor formed upon the semiconductor substrate and that additional features not depicted may also be present.

First interlevel dielectric 428 (similar to first interlevel dielectric 328 depicted in FIG. 5) is preferably formed across dummy transistors 414 and 430 to isolate them from conductive interconnect lines, as described above. According to a production methodology, a first layer of interconnect (similar to first interconnect 336 depicted in FIG. 5) may be formed upon an upper surface of first interlevel dielectric 428. As depicted in FIG. 6, a test reticle may be used to pattern a conductive layer deposited upon the interlevel dielectric to form test structure 444 (in lieu of the first interconnect) at select die upon the wafer. In one embodiment, test structures may be patterned upon only a portion of the die sites. In an alternative embodiment, the test structures may be patterned upon substantially all die sites on the wafer to test for spatial variation in processing.

Although FIG. 6 depicts formation of a test structure upon a first interlevel dielectric, it should be noted that according to the short flow methodology, test structures may be formed at any point in the processing sequence. In particular, the test structures as described in the present application may be formed at any point in the processing flow at which a thin conductive layer is patterned.

As depicted in FIGS. 5 and 6, elevational profiles 300 and 400 are elevationally similar to a production integrated circuit topography. Topographies 300 and 400 differ from a production topography in that elevational profiles 300 and 400 lack features that do not substantially affect the elevational disparity of the integrated circuit. Such features include shallow trench isolation regions, lightly doped drain regions, source and drain regions, and inter-level contacts (e.g., vias). Further, processing steps that do not substantially affect the elevational disparity of the integrated circuit, such as cleaning the upper surface of the semiconductor substrate before forming the dummy transistors, may be omitted from the fabrication sequence according to the abbreviated flow in order to decrease the time and/or materials required to form the test structures and perform the testing.

Returning now to FIG. 4, the test structures may be analyzed for the presence of defects following removal of the photoresist, as shown in block 214. According to an embodiment in which the test structures are similar to test structure 50 depicted in FIG. 2, the test structure may be electrically probed or optically scanned as described above. Open circuits might be formed where the conductor crosses steps or discontinuities on the integrated circuit elevational profile. Open circuits might also be formed where thinning of the lines occurs due, e.g., to poor optical resolution. Further, open circuits might be formed if a contaminant particle is lodged upon the upper surface of the reticle during patterning such that radiation is not properly transmitted to a portion of the photoresist. The resulting pattern may contain an unintended "hole" in the conductive trace.

In addition, a short circuit may be formed between adjacent lines. For example, particulate matter deposited on the upper surface of the reticle may result in improper patterning of the test structure, such that extra material is included in the test structure patterned upon the integrated circuit elevational profile. Alternatively, particulate matter may deposit upon the test structure and connect adjacent conductive lines. According to a further alternative, the short circuit may be formed due to poor optical resolution of the test pattern.

According to an embodiment, test structures may be formed only at select sites on a wafer. According to an alternative embodiment, test structures may be formed across an entire wafer to enable identification of intra-wafer or spatial variations in processing. For example, formation of test structures across an entire wafer may reveal a regular pattern of defects across the wafer attributable to systematic errors in processing. Forming test structures across an entire wafer may also reveal that processing conditions vary between the center of the wafer and the edges such that functioning integrated circuits are produced only in certain regions of the wafer rather than across the entire wafer. According to this embodiment, the test structures may be formed either on substantially complete or on partially complete virtual topographies.

Figure 7:
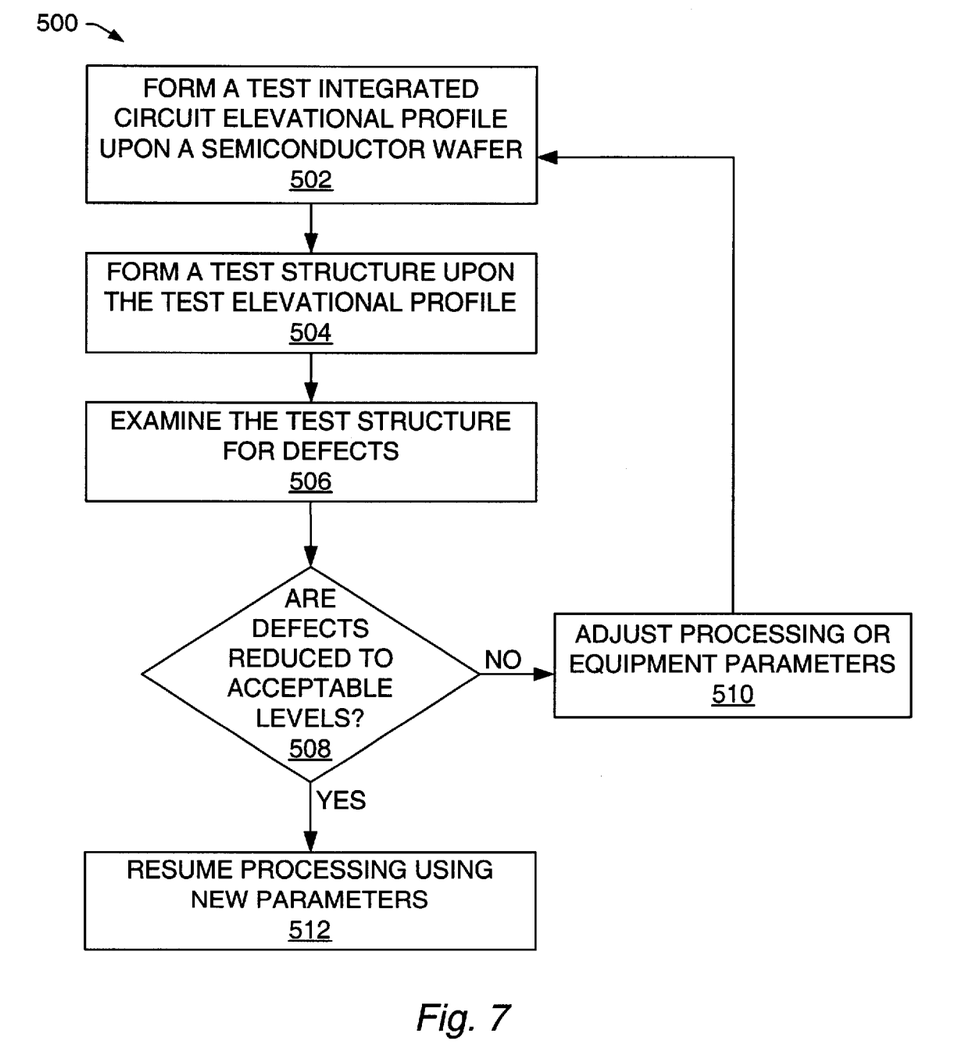
FIG. 7 depicts a flow diagram of a method for characterizing an integrated circuit fabrication methodology and equipment.

Turning now to FIG. 7, a flow diagram of a method 500 for characterizing an integrated circuit fabrication process and/or for evaluating integrated circuit fabrication equipment is depicted. In an embodiment, method 500 may be used to characterize the effects of modifications to existing processes on the defectivity of integrated circuits produced using the modified process. In an alternative embodiment, method 500 may be used to evaluate the effects of changes to existing equipment on the defectivity of integrated circuits produced using the equipment. The modifications to the process and/or the equipment may be performed in an effort to reduce the incidence of defects in integrated circuits produced using the process or equipment. That is, when defects are detected in production integrated circuits, the process and/or equipment may be modified to reduce the incidence of defects to acceptable levels.

As shown in block 502 of FIG. 7, a test integrated circuit elevational profile, similar to the elevational profile depicted in FIG. 5 or FIG. 6, may be fabricated upon a semiconductor wafer. The test elevational profile preferably includes features that affect elevational disparity while omitting nonelevational features such as implant regions. As shown in block 504, a test structure may then be patterned upon the test elevational profile using a test reticle, as previously described. As shown in block 506, the test structure may then be examined for defects using, for example, electronic or optical testing methods as previously described.

Following examination of the test structure, the effectiveness of the modifications to the processes or equipment may be evaluated, as shown in block 508. If the changes have proved ineffective at reducing defectivity to acceptable levels, processing parameters (e.g., temperature, processing time, material composition) or equipment parameters (e.g., thermocouples, pressure sensors) may be adjusted, as shown in block 510. Following the further changes, test elevational profiles and test structures may be formed upon new semiconductor wafers and the evaluation procedure repeated until the test wafers meet the desired criteria. At that point, processing of production wafers may be resumed using the new parameters, as shown in block 512.

Figure 8:
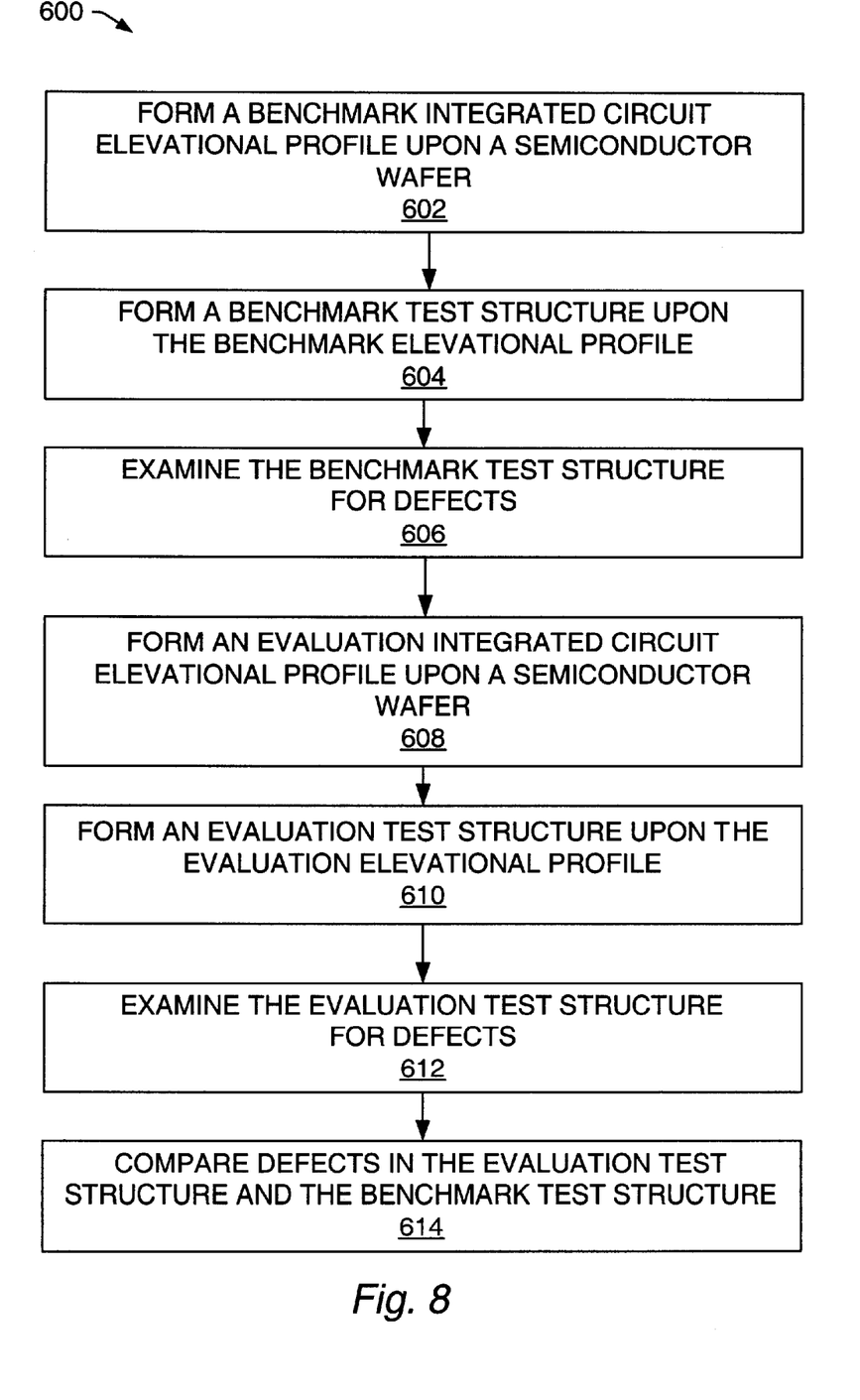
FIG. 8 depicts a flow diagram of a method for characterizing modifications to an existing integrated circuit fabrication methodology and equipment and for characterizing an alternative integrated circuit fabrication methodology and equipment.

FIG. 8 depicts a flow diagram of an alternative method 600 for characterizing an integrated circuit fabrication process and/or for evaluating integrated circuit fabrication equipment. Method 600 may be used to test the effects of modifications to fabrication processes or equipment as the result of ongoing research. That is, modifications to existing processes and/or equipment may be proposed as a part of desired continuous improvement in manufacturing rather than in response to any noted defects in product integrated circuits. Alternatively, method 600 may be used to evaluate new processes or equipment relative to existing ("benchmark") processes or equipment.

For example, if the use of a new metal etch tool were contemplated, knowledge about the resulting production topography would be desirable. According to the abbreviated flow described herein, wafers could go through the existing process flow through the deposition and patterning of polysilicon to form gate conductors. Because they do not affect the underlying elevational profile, subsequent ion implants used to form lightly doped drain areas and source/drain areas could be bypassed. Instead, the wafer could be transferred directly to the dielectric formation and metallization, followed by patterning and etching using the new equipment. The defectivity of integrated circuit elevational profiles fabricated using the new equipment could then be compared to the defectivity of benchmark elevational profiles formed using existing equipment, to determine the desirability of replacing the existing equipment.

The abbreviated flow also may allow expedited testing of new technology or materials using existing equipment. For example, a novel interlevel dielectric material may be evaluated for the degree of planarity that may be achieved. By skipping nonelevational steps such as ion implants, information on the effects of new equipment, processes, and/or materials on the integrated circuit topography may be obtained in days rather than weeks. The abbreviated flow methodology advantageously may be performed using the same programs used by the computer system controlling the production flow by simply bypassing undesired steps.

As shown in block 602 of FIG. 8, a benchmark integrated circuit elevational profile may be formed upon a semiconductor wafer. The benchmark elevational profile may be similar to the topography depicted in FIG. 5 or FIG. 6. The benchmark elevational profile is a reference elevational profile representative of topographies obtained using current fabrication processes or equipment. As shown in block 604, a benchmark test structure may be formed upon the benchmark elevational profile. The benchmark test structure is preferably formed by patterning a conductive material using a test reticle as previously described and may be similar in layout to test structures described previously. The benchmark test structure may then be examined for defects using, e.g., electrical and/or optical testing methods as previously described, as shown in block 606. The defectivity level in the benchmark test structure gives a standard for evaluating the proposed process or equipment against the existing process or equipment.

As shown in block 608, an evaluation integrated circuit elevational profile may then be formed upon another semiconductor wafer. The evaluation elevational profile is preferably similar elevationally to the benchmark topography to allow accurate comparison of the equipment or processes. That is, the same elevational features should be present in both the benchmark and the evaluation elevational profiles. An evaluation test structure may then be formed upon the evaluation elevational profile, as shown in block 610. The evaluation test structure should be formed using the same test reticle as the benchmark test structure to allow accurate comparison of the equipment or processes being evaluated. The evaluation test structure may be examined for defects using the same methodology by which the benchmark test structures are evaluated, as shown in block 612. The defectivity in the benchmark and evaluation test structures may then be compared, as shown in block 614. If the evaluation test structure shows equivalent or reduced defectivity compared to the benchmark test structure, then implementation of the new or modified technology may be considered beneficial.

It will be appreciated to those skilled in the art having the benefit of this disclosure that this invention is believed to provide a method for using a test structure and a virtual integrated circuit methodology and topography to characterize a production integrated circuit methodology that produces production integrated circuit topographies having a similar elevational profile to the virtual integrated circuit topography. It will be further appreciated that the test structure and virtual methodology and topography may be used to evaluate new equipment and new processes as well as modifications to existing equipment and processes. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for characterizing an integrated circuit fabrication process, comprising:

fabricating, across a wafer, a test integrated circuit elevational profile formed by a subset of steps within a sequence of steps of the integrated circuit fabricating process, wherein the sequence of steps culminates in a production integrated circuit intended for use by a consumer and wherein the subset substantially comprises processing steps that determine elevational disparity of said test integrated circuit elevational profile;

patterning a conductive material with a test reticle to form a test structure upon an upper surface of said test integrated circuit elevational profile; and applying stimuli to the test structure and examining said test structure for defects attributable to the subset of steps.

2. The method as recited in claim 1, wherein said fabricating a test integrated circuit elevational profile comprises forming an elevational profile equivalent to an elevational profile embodied within an integrated circuit topography intended for use by a consumer.

3. The method as recited in claim 2, wherein said subset comprises a majority of steps used in the integrated circuit fabrication process which impact on the elevational profile of the integrated circuit topography.

4. The method as recited in claim 2, wherein said subset comprises a minority of steps used in the integrated circuit fabrication process which impact on the elevational profile of the integrated circuit topography.

5. The method as recited in claim 1, wherein said patterning a conductive material comprises:

forming a first conductive line upon the test integrated circuit elevational profile, the first conductive line comprising a main portion with projections extending from the main portion; and forming a second conductive line upon the test integrated circuit elevational profile, the second conductive line laterally surrounding the projections such that a distance between the second conductive line and the first conductive line is substantially constant.

6. The method as recited in claim 5, wherein patterning said conductive material further comprises:

forming a third conductive line upon the test integrated circuit elevational profile; and forming a fourth conductive line upon the test integrated circuit elevational profile.

7. The method as recited in claim 1, wherein patterning said conductive material comprises forming, upon an upper surface of the test integrated circuit elevational profile, a first conductive line, a second conductive line, a third conductive line, and a fourth conductive line such that:

forming each of the first and fourth conductive lines comprises patterning a main portion and projections extending from the main portion; and forming each of the second and third conductive lines comprises patterning a serpentine line substantially surrounding the projections of the first and fourth conductive lines;

and such that a first distance between the first conductive line and the second conductive line is substantially constant, and such that a second distance between the first conductive line and third conductive line is substantially constant, and such that a third distance between the fourth conductive line and the second conductive line is substantially constant, and such that a fourth distance between the fourth conductive line and the third conductive line is substantially constant.

8. The method as recited in claim 7, wherein forming said first, second, third and fourth conductive lines comprises forming conductive lines having a width substantially equal to a width of conductive features of said production integrated circuit.

9. The method as recited in claim 7, wherein forming said first, second, third and fourth conductive lines comprises forming conductive lines having widths that are substantially constant.

10. The method as recited in claim 7, wherein patterning said conductive material further comprises forming test pads configured to be coupled to the conductive lines, the test pads being configured to receive an electrical probe during use.

11. The method as recited in claim 7, wherein patterning said conductive material comprises forming the first, second, third and fourth conductive lines such that the spacing between the first, second, third, and fourth conductive lines is substantially equal.

12. The method as recited in claim 1, wherein said patterning a conductive material comprises:

depositing the conductive material upon said upper surface;

depositing a photoresist upon said conductive material;

positioning the test reticle above said test integrated circuit elevational profile;

exposing portions of the photoresist not masked by said test reticle to radiation;

selectively removing said photoresist and said conductive material such that a test structure pattern is formed in said photoresist;

etching portions of said conductive material not masked by said photoresist such that said test structure is formed in said conductive material; and removing said photoresist from upon said conductive material.

13. The method as recited in claim 1, wherein said patterning a conductive material comprises patterning silicided polycrystalline silicon.

14. The method as recited in claim 1, wherein said patterning a conductive material comprises patterning a metal.

15. The method as recited in claim 1, wherein said applying stimuli to the test structure comprises probing portions of said test structure with an electrical probe.

16. The method as recited in claim 15, wherein examining said test structure for defects comprises comparing current conducted by portions of the test structure.

17. The method as recited in claim 1, further comprising:

fabricating, across an additional wafer, a benchmark integrated circuit elevational profile formed by an alternative subset of steps within an alternative sequence of steps of an alternative integrated circuit fabricating process, wherein the alternative sequence of steps culminates in an additional production integrated circuit intended for use by a consumer and wherein the alternative subset substantially comprises processing steps that determine elevational disparity of said benchmark integrated circuit elevational profile;

patterning an additional conductive material with the test reticle to form a benchmark test structure upon an upper surface of said benchmark integrated circuit elevational profile;

applying stimuli to the benchmark test structure and examining said benchmark test structure for defects attributable to the alternative subset of steps; and comparing said test structure defects with said benchmark test structure defects.

18. A method for evaluating integrated circuit fabrication equipment, comprising:

fabricating using said equipment, upon a semiconductor wafer, an integrated circuit elevational profile formed by a subset of steps within a sequence of steps of an integrated circuit fabricating process, wherein the sequence of steps culminates in a production integrated circuit intended for use by a consumer and wherein the subset substantially comprises processing steps that determine elevational disparity of said integrated circuit elevational profile;

patterning a conductive material with a test reticle to form a test structure upon an upper surface of the integrated circuit elevational profile; and applying stimuli to the test structure and examining said test structure for defects associated with said equipment.

19. The method as recited in claim 18, further comprising:

fabricating using alternative equipment, upon an additional semiconductor wafer, a benchmark integrated circuit elevational profile formed by an alternative subset of steps within a sequence of steps of an alternative integrated circuit fabricating process, wherein the alternative sequence of steps culminates in an additional production integrated circuit intended for use by a consumer and wherein the alternative subset substantially comprises processing steps that determine elevational disparity of said benchmark integrated circuit profile;

patterning an additional conductive material with the test reticle to form a benchmark test structure upon an upper surface of the benchmark integrated circuit elevational profile;

applying stimuli to the test structure and examining said test structure for defects associated with said alternative equipment; and comparing said defects associated with said equipment and said defects associated with said alternative equipment.

* * * * *